United States Patent
Choi et al.

(10) Patent No.: US 9,323,142 B2
(45) Date of Patent: Apr. 26, 2016

(54) METHODS OF REDUCING REGISTRATION ERRORS OF PHOTOMASKS AND PHOTOMASKS FORMED USING THE METHODS

(71) Applicant: Samsung Electronics Co., Ltd., Suwon-si (KR)

(72) Inventors: Jin Choi, Yongin-si (KR); Sukjong Bae, Seoul (KR); Inkyun Shin, Yongin-si (KR); Jeonghyeon Lee, Incheon (KR)

(73) Assignee: Samsung Electronics Co., Ltd. (KR)

( * ) Notice: Subject to any disclaimer, the term of this patent is extended or adjusted under 35 U.S.C. 154(b) by 60 days.

(21) Appl. No.: 14/319,281

(22) Filed: Jun. 30, 2014

(65) Prior Publication Data

US 2015/0050584 A1 Feb. 19, 2015

(30) Foreign Application Priority Data

Aug. 19, 2013 (KR) ........................ 10-2013-0098099

(51) Int. Cl.
*G03F 1/50* (2012.01)
*G03F 1/68* (2012.01)
*G03F 1/72* (2012.01)
*G03F 1/00* (2012.01)

(52) U.S. Cl.
CPC .. *G03F 1/72* (2013.01); *G03F 1/00* (2013.01); *G03F 1/50* (2013.01); *G03F 1/68* (2013.01)

(58) Field of Classification Search
CPC ............... G03F 1/50; G03F 1/68; G03F 1/72
USPC .................................... 430/5, 22, 30
See application file for complete search history.

(56) References Cited

U.S. PATENT DOCUMENTS

| | | | |
|---|---|---|---|
| 5,723,235 | A | 3/1998 | Tsudaka et al. |
| 6,208,469 | B1 | 3/2001 | Matsuura |
| 6,576,377 | B2 | 6/2003 | Kikuchi |
| 7,514,183 | B2 | 4/2009 | Hsu et al. |
| 7,736,819 | B2 | 6/2010 | Zait et al. |
| 7,763,397 | B2 | 7/2010 | Lee et al. |
| 8,097,539 | B2 | 1/2012 | Itoh |
| 8,189,903 | B2 | 5/2012 | Itoh |
| 2011/0250528 | A1 | 10/2011 | Oh |

FOREIGN PATENT DOCUMENTS

| | | |
|---|---|---|
| JP | 2010-152031 A | 7/2010 |
| KR | 1020100111128 A | 10/2010 |
| KR | 1020100127116 A | 12/2010 |

*Primary Examiner* — Christopher Young
(74) *Attorney, Agent, or Firm* — Myers Bigel Sibley, P.A.

(57) ABSTRACT

Methods of reducing registration errors of photomasks and photomasks formed using the methods are provided. The method may include forming a plurality of photomask patterns on a substrate and determining registration errors of the plurality of photomask patterns. The method may further include forming a plurality of stress-producing portions in the substrate to reduce the registration errors by considering exposure latitude variations.

19 Claims, 9 Drawing Sheets

METHODS OF REDUCING REGISTRATION ERRORS OF PHOTOMASKS AND PHOTOMASKS FORMED USING THE METHODS

CROSS-REFERENCE TO RELATED APPLICATION

This U.S. non-provisional patent application claims priority under 35 U.S.C. §119 to Korean Patent Application No. 10-2013-0098099, filed on Aug. 19, 2013, in the Korean Intellectual Property Office, the disclosure of which is hereby incorporated by reference in its entirety.

FIELD

The present disclosure generally relates to the field of electronics, and more particularly, to photomasks that are used to manufacture semiconductor devices.

BACKGROUND

Semiconductor devices are manufactured using various processes including photolithography processes, thin-film deposition processes, and etching processes. Photolithography processes, which may determine a minimum line width or a critical dimension (CD) of a semiconductor device, may include coating a photoresist layer on a substrate, exposing the photoresist layer to light, and developing the photoresist layer. Photomasks including photomask patterns may be used when a photoresist layer is exposed to light. Photomask manufacturing processes may cause variations in spaces between photomask patterns and variations in directions of the photomask patterns, and thus the photomask patterns may have registration errors.

SUMMARY

A photomask may include a plurality of photomask patterns on a substrate and a plurality of stress-producing portions in the substrate reducing registration errors of the plurality of photomask patterns. The substrate may include a low density region including some of the plurality of photomask patterns in a first density and a high density region including some of the plurality of photomask patterns in a second density higher than the first density. The low density region may include some of the plurality of stress-producing portions in a third density and the high density region may include some of the plurality of stress-producing portions in a fourth density lower than the third density thereby reducing exposure latitude variations resulting from transmittance drops of the substrate associated with the plurality of stress-producing portions.

According to various embodiments, the substrate may include an exposure region including some of the plurality of photomask patterns and a non-exposure region disposed adjacent an edge of the exposure region. The non-exposure region may be in the low density region In various embodiments, the exposure region may include a plurality of main pattern regions including respective some of the plurality of photomask patterns and a scribe line region provided between two adjacent ones of the plurality of main pattern regions. The scribe line region may be in the low density region.

In various embodiments, the plurality of stress-producing portions may include a contraction stress-producing portion applying a stress that reduces a volume of the substrate and an expansion stress-producing portion applying a stress that expands the volume of the substrate.

A method of reducing photomask registration errors may include forming a plurality of photomask patterns on a substrate, determining registration errors of the plurality of photomask patterns, determining exposure latitude variations of the plurality of photomask patterns and forming a plurality of stress-producing portions in the substrate to reduce the registration errors based on the exposure latitude variations.

According to various embodiments, the method may also include determining preliminary positions of the plurality of stress-producing portions to reduce the registration errors of the plurality of photomask patterns before determining the exposure latitude variations. Determining the exposure latitude variations may include calculating transmittance variations of the substrate based on the preliminary positions of the plurality of stress-producing portions.

In various embodiments, the method may further include determining variations in critical dimensions of the plurality of photomask patterns based on the exposure latitude variations and the transmittance variations.

In various embodiments, determining the variations in the critical dimensions of the plurality of photomask patterns may include multiplying the exposure latitude variations by the transmittance variations.

According to various embodiments, the method may also include designing a target layout including data on target photomask patterns. The exposure latitude variations may be determined using exposure latitude modeling based on to a profile of the target photomask patterns.

In various embodiments, the exposure latitude modeling may include determining an exposure latitude from the profile of the target photomask patterns and determining variations of the exposure latitude resulting from the transmittance variations of the substrate.

In various embodiments, the transmittance variations of the substrate may be associated with dose variations of a light irradiated to the photomask patterns.

According to various embodiments, the method may additionally include mapping the registration errors into the substrate and classifying the registration errors according to magnitudes of the registration errors.

In various embodiments, the method may include mapping the exposure latitude variations into an exposure latitude variation map and classifying the exposure latitude variations according to magnitudes of the exposure latitude variations. The exposure latitude variation map may include a sensitive region having a first transmittance variation and an insensitive region having a second transmittance variation larger than the first transmittance variation.

In various embodiments, the substrate may include an exposure region including ones of the plurality of photomask patterns and a non-exposure region adjacent an edge of the exposure region. The exposure region may include first ones of the plurality of stress-producing portions in a first density and the non-exposure region may include second ones of the plurality of stress-producing portions in a second density higher than the first density.

According to various embodiments, the exposure region may include a plurality of main pattern regions including respective ones of the plurality of photomask patterns and a scribe line region provided between adjacent ones of the plurality of main pattern regions. One of the plurality of main pattern regions may include third ones of the plurality stress-producing portions in a third density and the scribe line region may include fourth ones of the plurality stress-producing portions in a fourth density higher than the third density.

A method of forming a photomask may include forming a plurality of photomask patterns on first and second regions of a substrate, and the first region may include a higher density of the photomask patterns than the second region. The method may also include forming a plurality of stress-producing portions in the first and second regions of the substrate, and the first region may include a lower density of the stress-producing portions than the second region.

According to various embodiments, the first region may include a main pattern region including ones of the plurality of photomask patterns and the second region may include a scribe line region adjacent an edge of the main pattern region.

In various embodiments, the first region may include an exposure region, in a central region of the substrate, which includes ones of the plurality of photomask patterns and the second region may include a non-exposure region adjacent an edge of the substrate.

In various embodiments, forming the plurality of stress-producing portions may include forming a contraction stress-producing portion applying a stress that reduces a volume of the substrate and forming an expansion stress-producing portion applying a stress that expands the volume of the substrate.

According to various embodiments, the method may further include determining registration errors of the plurality of photomask patterns before forming the plurality of stress-producing portions, determining preliminary positions of the plurality of stress-producing portions based on the registration errors of the plurality of photomask patterns and determining exposure latitude variations of the plurality of photomask patterns using the preliminary positions of the respective plurality of stress-producing portions. Forming the plurality of stress-producing portions in the substrate may be based on magnitudes of the exposure latitude variations.

According to various embodiments, the method may additionally include mapping the exposure latitude variations into an exposure latitude variation map and classifying the exposure latitude variations according to the magnitudes of the exposure latitude variations.

A method of forming a photomask may include forming a plurality of photomask patterns on a substrate, determining registration errors of the plurality of photomask patterns, determining preliminary positions of a respective plurality of stress-producing portions based on the registration errors of the plurality of photomask patterns and determining exposure latitude variations of the plurality of photomask patterns using the preliminary positions of the respective plurality of stress-producing portions. The method may also include determining first and second regions of the substrate based on magnitudes of the exposure latitude variations and the first region may have a first exposure latitude variation and the second region may have a second exposure latitude variation smaller than the first exposure latitude variation. The method may further include forming a plurality of stress-producing portions in the first and second regions of the substrate and the first region may include a lower density of the stress-producing portions than the second region.

According to various embodiments, determining exposure latitude variations may include calculating changes in a slope of a threshold value of an exposure intensity profile.

In various embodiments, the first region may include a higher density of the photomask patterns than the second region.

DETAILED DESCRIPTION

Figure 1:
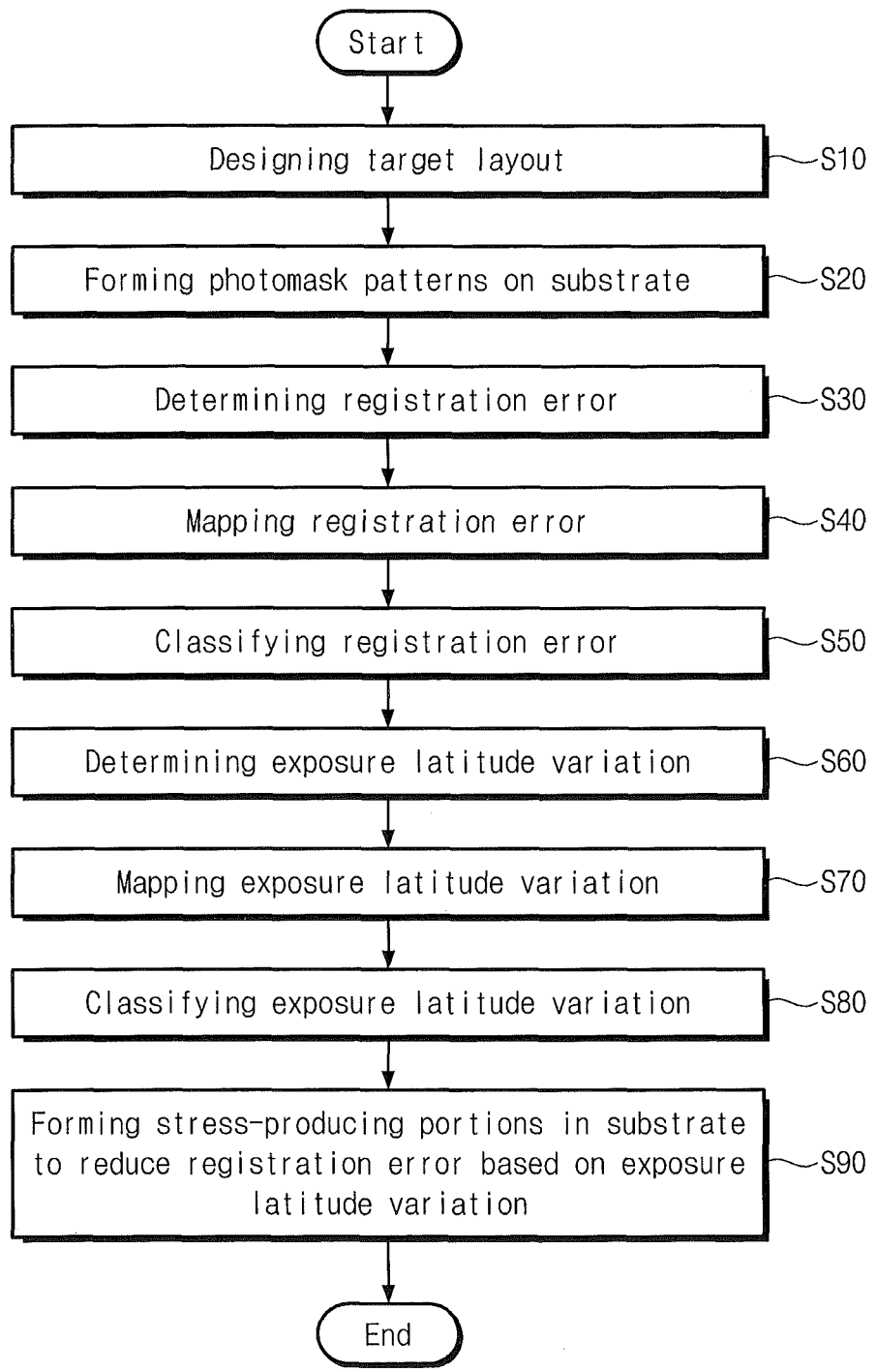
FIG. 1 is a flow chart illustrating a method of reducing photomask registration errors, according to some embodiments of the present inventive concept.

Some example embodiments of the inventive concepts will now be described with reference to the accompanying drawings. Some embodiments of the inventive concepts may, however, be embodied in many different forms and should not be construed as being limited to the embodiments set forth herein. Rather, these embodiments are provided so that this disclosure will be thorough and complete, and will convey the scope of the disclosure to those of ordinary skill in the art. In the drawings, the sizes and relative sizes of layers and regions may be exaggerated for clarity. Like reference numbers refer to like elements throughout.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of some embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, steps, operations, elements and/or components, but do not preclude the presence or addition of one or more other features, steps, operations, elements, components and/or groups thereof.

Some example embodiments of the inventive concepts are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments of the inventive concepts should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which some embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a flow chart illustrating a method of reducing photomask registration errors, according to some embodiments of the present inventive concept. Referring to FIG. 1, a target layout may be designed (S10). The target layout may be designed to include photomask patterns, which are transferred onto a wafer through photolithography processes. Shapes, sizes and positions of the photomask patterns may vary depending on semiconductor devices manufactured by using the photomask patterns. Each target layout may be prepared to contain information on tens of thousands to hundreds of millions of photomask patterns. Hereinafter, the photomask patterns in the target layout (S10) are referred as to target photomask patterns. A host computer or a sever in a system may provide the target layout.

Figure 2:
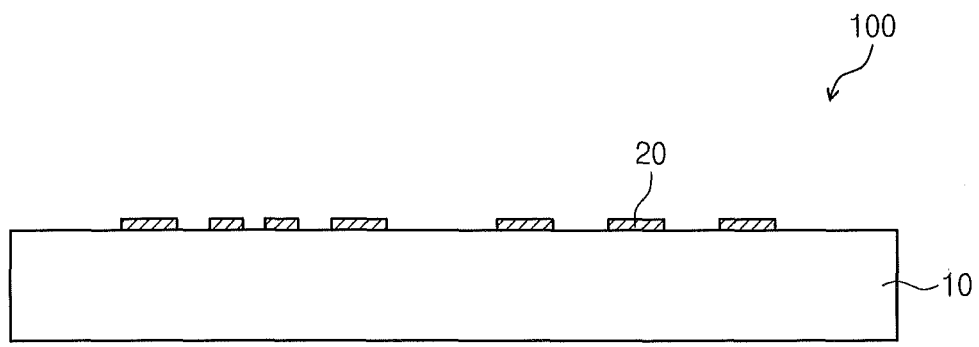
FIG. 2 is a cross-sectional view illustrating a photomask.

FIG. 2 is a cross-sectional view illustrating a photomask. Referring to FIGS. 1 and 2, photomask patterns 20 may be formed on a substrate 10 (S20). The substrate 10 may be, for example, a transparent substrate, a reflective substrate, or an absorptive substrate. The substrate 10 may include glass or quartz. The photomask patterns 20 may include a metal layer, for example, a chromium layer. The photomask patterns 20 may be formed on the substrate 10 using a photomask fabrication system. In some embodiments, the photomask fabrication system may include an electron-beam lithography system and the electron beam lithography system may cause positional errors of the photomask patterns 20. For example, the positional errors of the photomask patterns 20 may occur when a stage in the electron beam lithography system is moved. The positional errors of the photomask patterns 20 may locally distort or deform the photomask patterns 20 formed on the substrate 10. It will be understood that spaces between the photomask patterns 20 may be changed during a lithography process, and thus the electron beam lithography system may cause global positional errors.

Positional errors may be defined in terms of registration and orthogonality. The registration is a parameter representing how uniform spaces or pitches of the photomask patterns have, and the orthogonality is a parameter representing how exact directions of the photomask patterns are. For example, exactness in position of the photomask patterns may be represented in terms of the registration, and exactness in angle of the photomask patterns may be represented in terms of the orthogonality. Hereinafter, for the sake of brevity, the two types of errors, registration and orthogonality, will more generally be referred to as registration errors.

Figure 3:
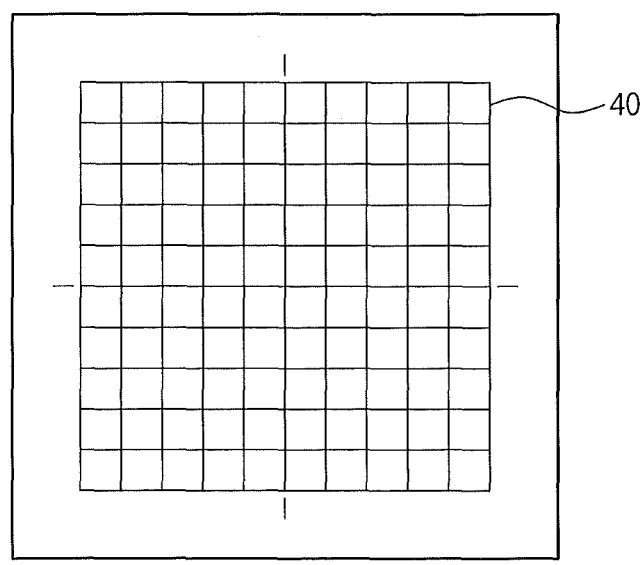
FIG. 3 illustrates a registration map of photomask patterns in a target layout.

FIG. 3 illustrates a registration map of photomask patterns in a target layout. Referring to FIGS. 2 and 3, an ideal registration map 40 illustrated in FIG. 3 may be obtained where the photomask patterns 20 formed on the substrate 10 have a zero registration error. Accordingly, the photomask patterns 20 may be formed to have shapes and positions same as shapes and positions of target photomask patterns in the target layout. It will be understood that most photomask patterns may have a certain level or some amount of registration errors originating from a photomask fabrication system and/or defects of the substrate 10. For example, the substrate 10 may have an uneven surface, a curved surface or a slanted surface, and the photomask patterns 20 may be formed to have registration errors in a local or an entire region, even though the lithography process may not cause any registration errors.

The method may include measuring or otherwise determining registration errors (S30). The registration errors may be determined by comparing the photomask patterns 20 formed on the substrate 10 with the target photomask patterns in the target layout in terms of positions and shapes. Positions and shapes of the photomask patterns 20 may be obtained by using an optical inspection system. As described above, the photomask patterns 20 formed on the substrate 10 may have registration errors compared with the target photomask patterns. Each of the registration errors may represent a block of the photomask patterns 20 or individual photomask patterns 20. In some embodiments, registration errors may be measured or determined using a registration error tolerance, which may be predetermined for a substrate or each photomask patterns. Magnitudes of registration errors that deviate from the registration error tolerance, positively or negatively, may be determined and saved.

Figure 4:
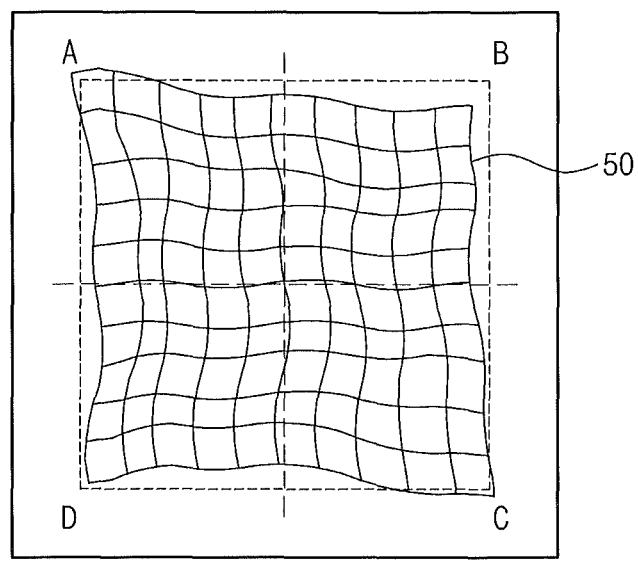
FIG. 4 illustrates a registration map of the photomask patterns including registration errors.

FIG. 4 illustrates a registration map of the photomask patterns including registration errors. Referring to FIGS. 1 through 4, mapping the registration errors may be performed (S40). The actual registration map 50 of the photomask patterns 20 having registration errors may have a shape distorted from the ideal registration map 40. The photomask patterns 20 on the substrate 10 may have positive or negative registration errors in a horizontal direction and/or a vertical direction. For example, the photomask patterns 20 may have positive registration errors at regions of A and C and negative registration errors at regions of B and D.

Figure 5:
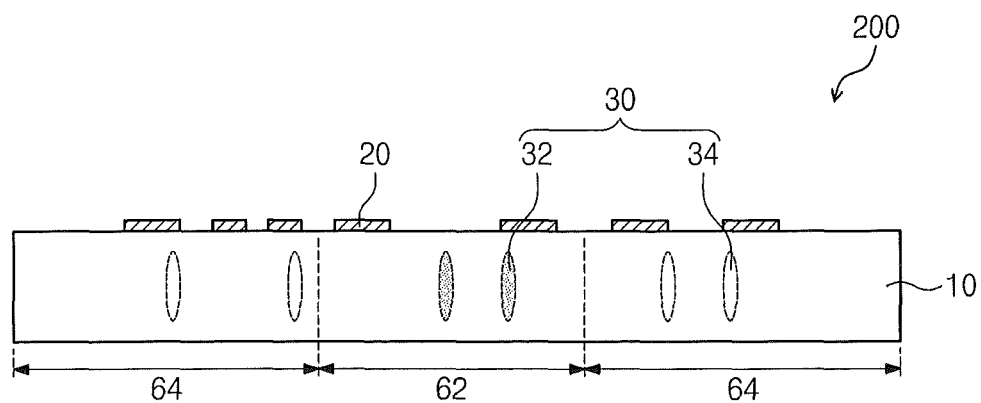
FIG. 5 is a cross-sectional view illustrating a photomask including stress-producing portions at preliminarily positions according to some embodiments of the present inventive concept.

FIG. 5 is a cross-sectional view illustrating a photomask including stress-producing portions at preliminarily positions according to some embodiments of the present inventive concept. Referring to FIGS. 1, 4, and 5, the registration errors may be classified according to magnitude (S50), and positions where the stress-producing portions 30 can be located in the substrate 10 may be predicted or preliminarily determined. The positions where stress-producing portions 30 are located in the substrate 10 may be determined to correct or reduce the registration errors. The stress-producing portions 30 may include expansion stress-producing portions 32 and contraction stress-producing portions 34. In some embodiments, the substrate 10 may include an expansion region 62 including some of the expansion stress-producing portions 32 and contraction regions 64 including some of the contraction stress-producing portions 34. For example, each of the expansion and contraction regions 62 and 64 may be designed to have an area of about 50 μm×50 μm or 100 μm×100 μm.

A registration map of registration errors, as corrected or reduced using the stress-producing portions 30 located at the preliminarily determined positions, may be estimated or obtained based on various data of the stress-producing portions 30. The various data of the stress-producing portions 30 may include, for example, a number or positions, and actual registration errors of the photomask patterns 20. The various data of the stress-producing portions 30 may also include a process standard or other data established by an experiment. For example, the various data may include detailed information on types, sizes, a number or positions of the stress-producing portions 30 according to characteristics of the registration errors including, for example, magnitude or polarity. It will be understood that the stress-producing portions 30 of FIG. 5 may not be actually formed in the substrate 10 when the registration errors are classified. The predicted or preliminarily determined positions may be used to obtain the registration map of registration errors, as corrected or reduced using the stress-producing portions 30.

Figure 6:
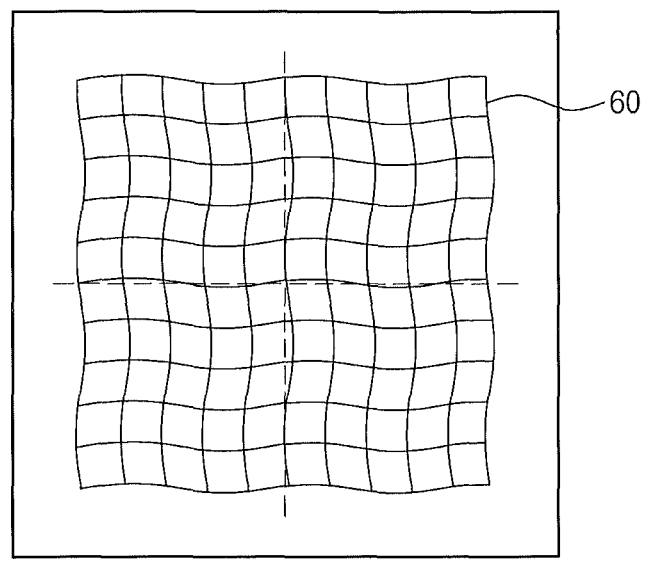
FIG. 6 illustrates a registration map of registration errors corrected or reduced using the stress-producing portions according to some embodiments of the present inventive concept.

FIG. 6 illustrates a registration map of registration errors corrected or reduced using the predicted or preliminarily determined positions of the stress-producing portions according to some embodiments of the present inventive concept. Referring to FIGS. 3, 5, and 6, the registration map 60 of registration errors corrected or reduced using the stress-producing portions 30 may be similar to the ideal registration map 40. Stated in other words, the registration map 60 shows the registration errors that are corrected or reduced using the stress-producing portions 30 and thus may be very small. However, as appreciated by the present inventors, the stress-producing portions 30 may cause reduction in transmittance of the substrate 10. Accordingly, reduction in transmittance may occur in at least one of the expansion region 62 and the contraction regions 64 because of the stress-producing portions 30 and thus may have a lowered transmittance. It will be understood that the reduction in transmittance of the substrate 10 may result in changes in line widths or critical dimensions (CDs) of the photomask patterns 20.

A CD variation of the photomask patterns 20 may be determined by a multiplication of a variation in transmittance and an exposure latitude variation of the substrate 10. The variation in transmittance of the substrate 10 may be associated with a variation in dose of an exposure light, which is provided on the photomask patterns 20. Accordingly, an exposure latitude variation ($\Delta EL$) may be given by dividing the CD variation ($\Delta CD$) of the photomask patterns 20 by the dose variation ($\Delta dose$). The exposure latitude variation ($\Delta EL$), the CD variation ($\Delta CD$), and the dose variation ($\Delta dose$) will be described in more detail with reference to FIGS. 7A and 7B.

Figure 7A:
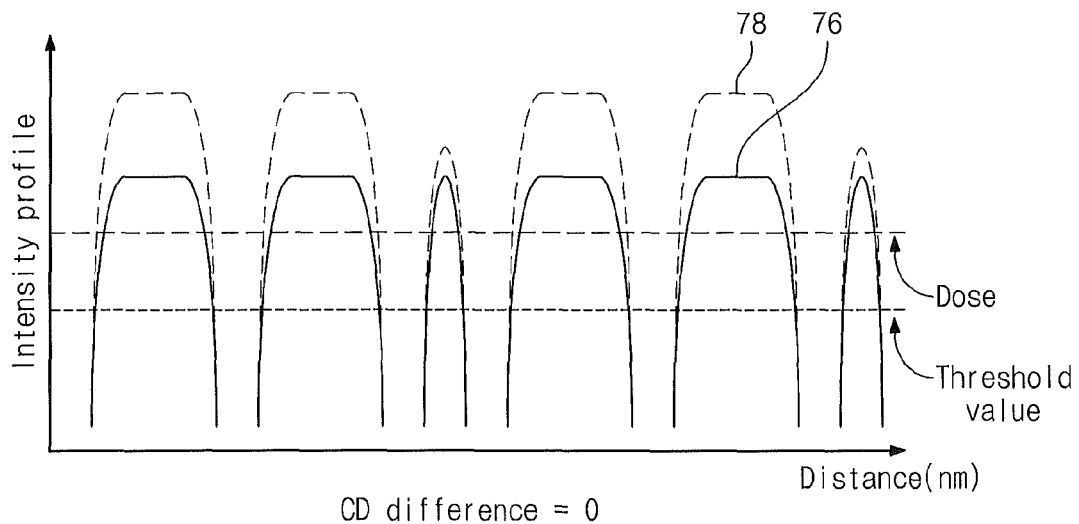
FIG. 7A illustrates a dose variation at the photomask patterns of the substrate, when a critical dimension variation ($\Delta CD$) is zero.

FIG. 7A illustrates a dose variation at the photomask patterns of the substrate, when a critical dimension variation ($\Delta CD$) is zero. Referring to FIGS. 5 and 7A, it may be necessary to provide an exposure light having an increased dose onto the photomask patterns 20 when the transmittance of the substrate 10 decreases. Because of the increase in dose of the exposure light, the photomask patterns 20 on the substrate 10 may have an exposure intensity profile 78 increased from an exposure intensity profile 76 of the target photomask patterns. It will be understood that a threshold value in the dose of the exposure light may be determined according to characteristics of a photoresist layer to be used for the photolithography process. For example, the threshold value in the dose of the photomask patterns 20 may be higher for a photoresist layer having low sensitivity than for a photoresist layer having high sensitivity. The photomask patterns 20 having small CD may be significantly affected by an increase in the dose of the exposure light, compared with the photomask patterns 20 having large CD. If the transmittance decreases uniformly per unit area, the dose of the exposure light may be reduced as shown in FIG. 7B.

Figure 7B:
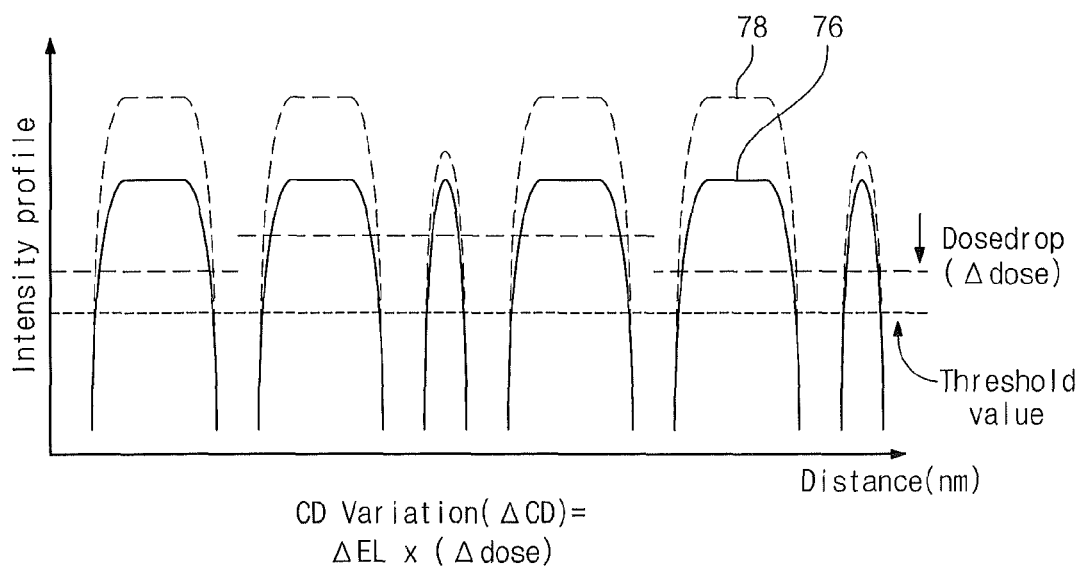
FIG. 7B illustrates a reduction in intensity of an exposing light, according to critical dimensions (CDs) of the photomask patterns.

FIG. 7B illustrates a reduction in intensity of an exposing light, according to critical dimensions (CDs) of the photomask patterns. Referring to FIGS. 5, 7A, and 7B, a reduction in the dose of the exposure light may be large for the photomask patterns 20 having large CDs and may be relatively small for the photomask patterns 20 having small CDs where the transmittance drop causes variations in the CDs of the photomask patterns 20. This means that, in the case where the dose per unit area is dropped constantly, a CD of each of the photomask patterns 20 may vary according to the exposure latitude variation ($\Delta EL$). The CD variations of the photomask patterns 20 mean that registration errors may not be corrected or reduced appropriately. Accordingly, methods according to some embodiments of the present inventive concept may reduce registration errors and exposure latitude variations ($\Delta EL$) by considering dose and/or transmittance drops and by examining exposure latitude variations ($\Delta EL$) of the photomask patterns 20 as well.

Referring back to FIGS. 1 and 5, the method may include determining exposure latitude variations ($\Delta EL$) of the photomask patterns 20 (S60). The exposure latitude variations ($\Delta EL$) may be determined by modeling exposure latitudes, as described with reference to FIG. 8.

Figure 8:
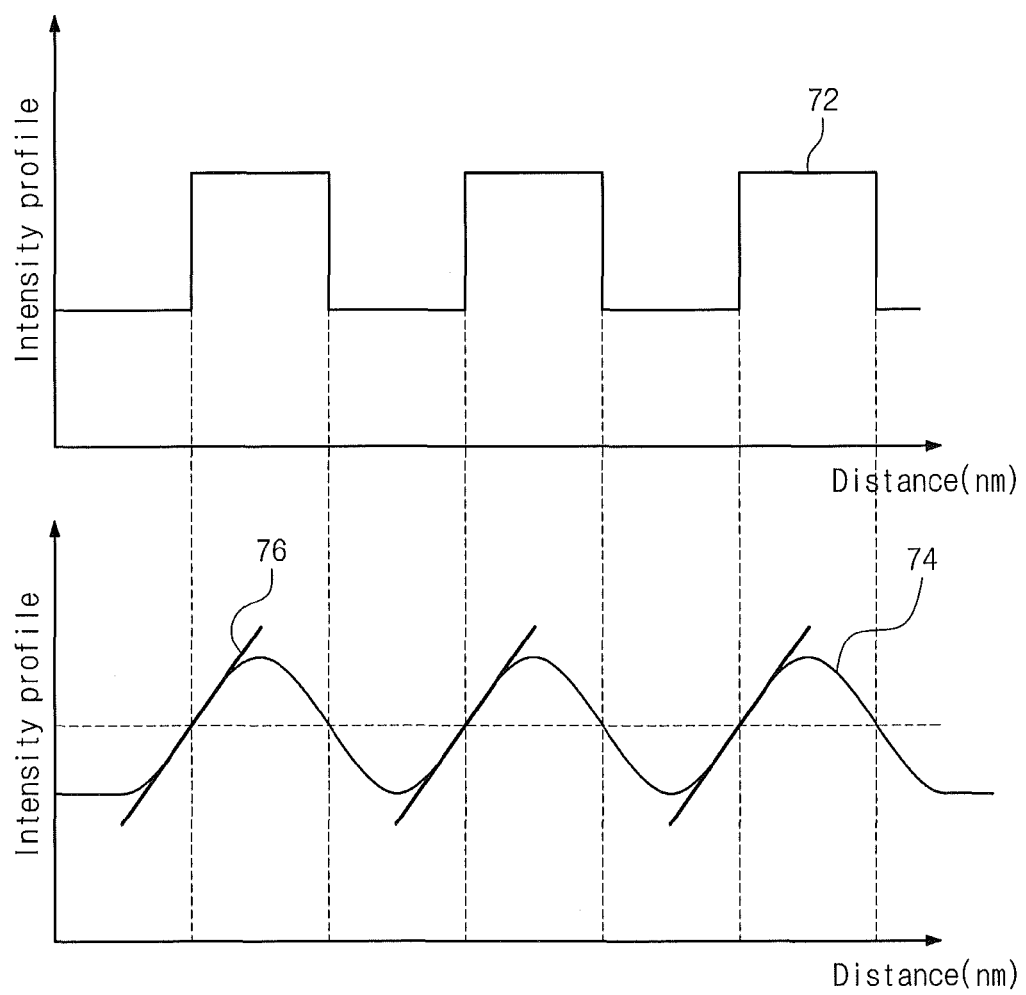
FIG. 8 illustrates an intensity profile of target photomask patterns, an exposure intensity profile, and an exposure latitude according to some embodiments of the present inventive concept.

FIG. 8 illustrates an intensity profile of target photomask patterns, an exposure intensity profile, and an exposure latitude according to some embodiments of the present inventive concept. Referring to FIGS. 5 and 8, the exposure intensity profile 74 may be calculated by convoluting the intensity profile 72 of the target photomask patterns and the characteristics of an optical system in the exposure system. The characteristics of an optical system may be determined by an aperture ratio (NA) or a magnification of a lens in the exposure system. The exposure latitude 76 may be a slope of the threshold value of the exposure intensity profile 74 with respect to the target photomask patterns in the target layout. The slope of the threshold value of the exposure intensity profile 74 may be calculated by using one of the known photolithography design methods.

The exposure latitude variations ($\Delta EL$) may be calculated from changes in the slope of the threshold value of the exposure intensity profile, which may originate from the stress-producing portions 30 or may be caused by transmittance drops and/or dose drops. A modeling of the exposure latitude may include calculating the exposure latitude 76 from the target photomask patterns, and then calculating the exposure latitude variations ($\Delta EL$) from changes in the exposure latitude 76, which may be caused by the transmittance drops of the photomask patterns 20. The exposure latitude variations ($\Delta EL$) may represent a change in the exposure latitudes, which may be caused by the stress-producing portions 30 and transmittance drop of the substrate 10.

Figure 9:
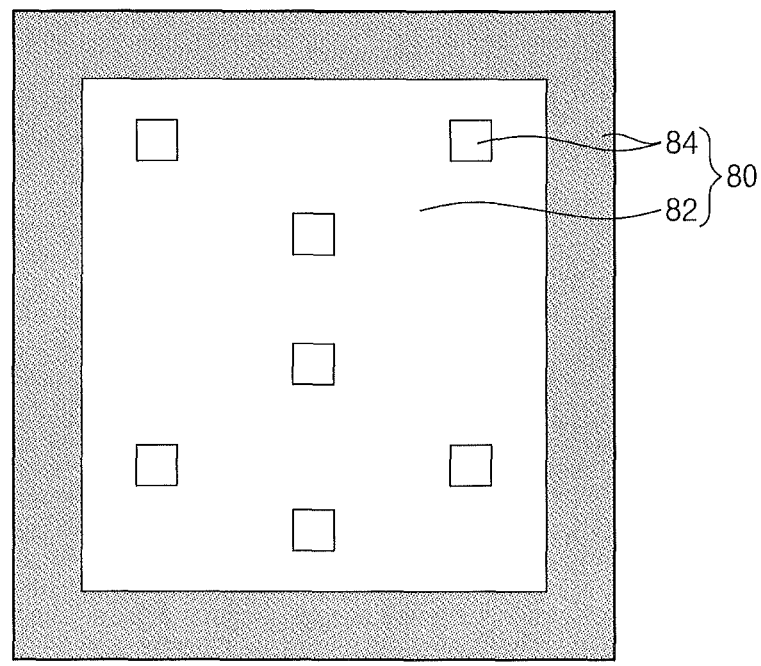
FIG. 9 is a diagram illustrating an exposure latitude map according to some embodiments of the present inventive concept.

FIG. 9 is a diagram illustrating an exposure latitude map according to some embodiments of the present inventive concept. Referring to FIGS. 1, 5, and 9, the method may include mapping the exposure latitude variations ($\Delta EL$). In some embodiments, the exposure latitude map 80 may include a sensitive region 82 and an insensitive region 84. For example, the sensitive region 82 may have a large exposure latitude variation ($\Delta EL$) and the insensitive region 84 may have a relatively small exposure latitude variation ($\Delta EL$) compared with the sensitive region 82. Stated in other words, the sensitive region 82 may be a region where dose or transmittance drops caused by the stress-producing portions 30 should be decreased. The insensitive region 84 may be a region where a CD variation is small even if dose or transmittance drop caused by the stress-producing portions 30 is large. In some embodiments, positions where stress-producing portions 30 are located may be predicted or preliminarily determined in the insensitive region 84, where the exposure latitude variation (ΔEL) is substantially zero.

Figure 10:
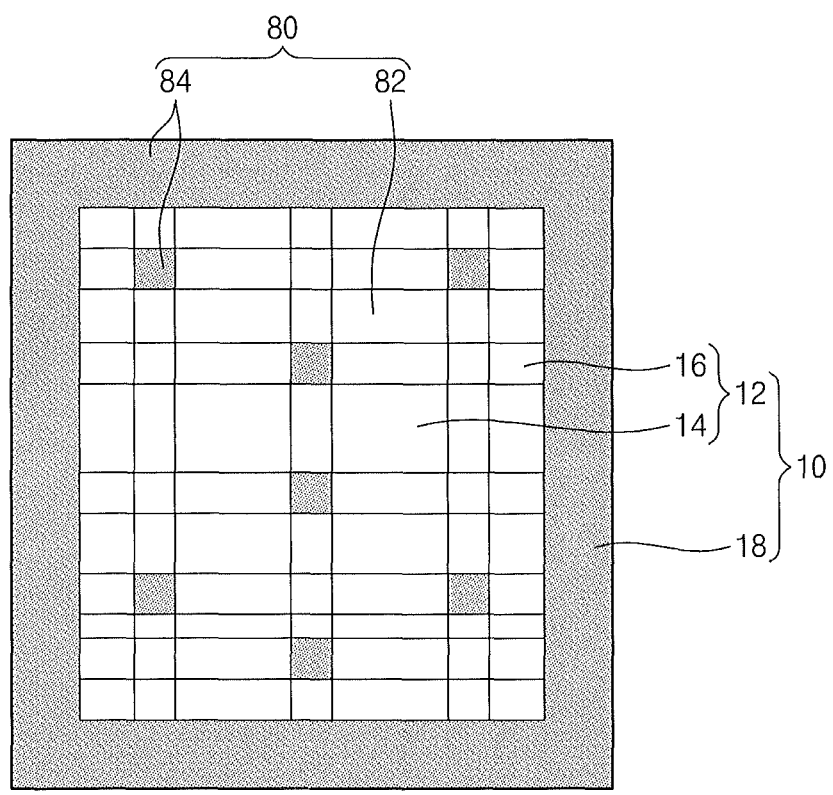
FIG. 10 is a diagram illustrating the exposure latitude map overlapped with the substrate according to some embodiments of the present inventive concept.

FIG. 10 is a diagram illustrating the exposure latitude map overlapped with the substrate according to some embodiments of the present inventive concept. Referring to FIGS. 1, 5, and 10, the exposure latitude variations (ΔEL) may be classified according to magnitude (S80). The exposure latitude variations (ΔEL) may be classified in the exposure latitude map 80. It will be understood that the insensitive region 84 in the exposure latitude map 80 may have a substantially zero exposure latitude variation (ΔEL), and the sensitive region 82 may have the exposure latitude variations (ΔEL) greater than zero.

The substrate 10 may include an exposure region 12 and a non-exposure region 18. The exposure region 12 may be provided in a central region of the substrate 10. The non-exposure region 18 may be provided adjacent an edge of the exposure region 12 or adjacent of an edge region of the substrate 10. The exposure region 12 may have a low exposure latitude variation (ΔEL). The exposure region 12 may include main pattern regions 14 and scribe line regions 16. Most of the photomask patterns 20 may be provided in the main pattern regions 14, and only few photomask patterns 20 may be provided in the scribe line region 16. In some embodiments, the main pattern region 14 of the exposure region 12 may be classified as the sensitive region 82. The non-exposure region 18 and the scribe line region 16 of the substrate 10 may be classified as the insensitive region 84. For example, the stress-producing portions 30 may be designed to be provided in the non-exposure region 18 and the scribe line region 16 of the substrate 10. In some embodiments, the non-exposure region 18 may be a bar-code region having a substantially zero exposure latitude variation (ΔEL).

Figure 11:
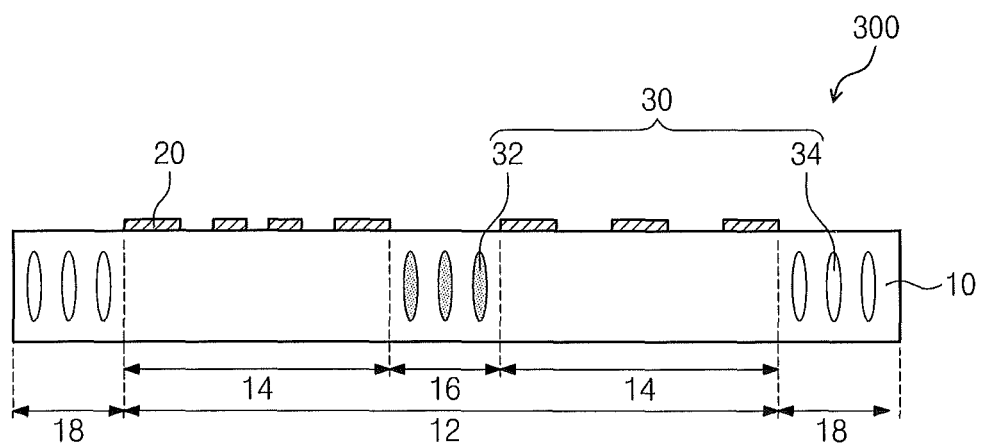
FIG. 11 is a cross-sectional view of a photomask including stress-producing portions according to some embodiments of the present inventive concept.

FIG. 11 is a cross-sectional view of a photomask including stress-producing portions according to some embodiments of the present inventive concept. Referring to FIGS. 1, 10, and 11, the method may include forming stress-producing portions 30 in the substrate 10 to correct or reduce registration errors by considering exposure latitude variations (ΔEL) (S90). In some embodiments, most of the stress-producing portions 30 may be formed in the scribe line region 16 and the non-exposure region 18. The scribe line region 16 and the non-exposure region 18 may be low-density regions including only few or no photomask patterns 20. In some embodiments, the expansion stress-producing portions 32 may be formed in the scribe line region 16 of the substrate 10, and the contraction stress-producing portions 34 may be formed in the non-exposure region 18 of the substrate 10. In some embodiments, the contraction stress-producing portions 34 may be formed in the scribe line region 16 of the substrate 10, and the expansion stress-producing portions 32 may be formed in the non-exposure region 18 of the substrate 10.

The main pattern region 14 of the exposure region 12 may be a high-density region including most of the photomask patterns 20. The photomask patterns 20 may be densely provided in the main pattern region 14. Only few stress-producing portions 30 or no stress-producing portions 30 may be formed in the high density region or the main pattern region 14 of the substrate 10. The stress-producing portions 30 may be rarely or never formed in the high density region or the main pattern region 14 of the substrate 10. Accordingly, line widths or CDs of the photomask patterns 20 on the main pattern region 14 may not be distorted by the stress-producing portions 30.

The stress-producing portions 30 may be formed in the substrate 10 using a laser system. The laser system may be configured to irradiate laser pulse, whose frequency, duration, and energy are controlled, onto the substrate 10. In some embodiments, the laser system may include a Ti:sapphire light source generating a femto-second laser pulse. The formation of the stress-producing portions 30 using the laser system may be performed using one of the known processes.

According to some embodiments of the present inventive concept, a method of reducing registration errors may include determining exposure latitude variations. Registration errors may be reduced using stress-producing portions formed in a substrate. However, the stress-producing portions may cause transmittance drops or reduced transmittance. The exposure latitude variations may be calculated in consideration of the transmittance drops or reduced transmittance. The exposure latitude variations may be larger than zero in the main pattern region of the substrate and may be substantially zero in the scribe line region of the main pattern region and a non-exposure region adjacent an edge of the main pattern region. The stress-producing portions may be formed in a region of the substrate having exposure latitude variation is relatively small. For example, most of the stress-producing portions may be provided in the scribe line region and the non-exposure region of the substrate. Accordingly, the stress-producing portions may not distort critical dimensions of the photomask patterns on the main pattern region.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of reducing photomask registration errors, comprising:
   forming a plurality of photomask patterns on a substrate;
   determining registration errors of the plurality of photomask patterns;
   determining preliminary positions of a plurality of stress-producing portions to reduce the registration errors of the plurality of photomask patterns;
   determining exposure latitude variations of the plurality of photomask patterns, wherein determining the exposure latitude variations comprises calculating transmittance variations of the substrate based on the preliminary positions of the plurality of stress-producing portions; and
   forming the plurality of stress-producing portions in the substrate to reduce the registration errors based on the exposure latitude variations.

2. The method of claim 1, further comprising:
   determining variations in critical dimensions of the plurality of photomask patterns based on the exposure latitude variations and the transmittance variations.

3. The method of claim 2, wherein determining the variations in the critical dimensions of the plurality of photomask patterns comprises multiplying the exposure latitude variations by the transmittance variations.

4. The method of claim 1, further comprising:
   designing a target layout including data on target photomask patterns, wherein the exposure latitude variations are determined using exposure latitude modeling based on to a profile of the target photomask patterns.

5. The method of claim 4, wherein the exposure latitude modeling comprises:

determining an exposure latitude from the profile of the target photomask patterns; and determining variations of the exposure latitude resulting from the transmittance variations of the substrate.

6. The method of claim 1, wherein the transmittance variations of the substrate are associated with dose variations of a light irradiated to the photomask patterns.

7. The method of claim 1, further comprising:
mapping the registration errors into the substrate; and
classifying the registration errors according to magnitudes of the registration errors.

8. The method of claim 1, further comprising:
mapping the exposure latitude variations into an exposure latitude variation map; and
classifying the exposure latitude variations according to magnitudes of the exposure latitude variations,
wherein the exposure latitude variation map comprises a sensitive region having a first transmittance variation and an insensitive region having a second transmittance variation larger than the first transmittance variation.

9. The method of claim 1, wherein the substrate comprises:
an exposure region including ones of the plurality of photomask patterns; and
a non-exposure region adjacent an edge of the exposure region, wherein the exposure region comprises first ones of the plurality of stress-producing portions in a first density and the non-exposure region comprises second ones of the plurality of stress-producing portions in a second density higher than the first density.

10. The method of claim 9, wherein the exposure region comprises:
a plurality of main pattern regions including respective ones of the plurality of photomask patterns; and
a scribe line region provided between adjacent ones of the plurality of main pattern regions,
wherein one of the plurality of main pattern regions comprises third ones of the plurality stress-producing portions in a third density and the scribe line region comprises fourth ones of the plurality stress-producing portions in a fourth density higher than the third density.

11. A method of forming a photomask, comprising:
forming a plurality of photomask patterns on first and second regions of a substrate, wherein the first region comprises a higher density of the photomask patterns than the second region; and
forming a plurality of stress-producing portions in the first and second regions of the substrate, wherein the first region comprises a lower density of the stress-producing portions than the second region.

12. The method of claim 11, wherein:
the first region comprises a main pattern region including ones of the plurality of photomask patterns; and
the second region comprises a scribe line region adjacent an edge of the main pattern region.

13. The method of claim 11, wherein:
the first region comprises an exposure region, in a central region of the substrate, including ones of the plurality of photomask patterns; and
the second region comprises a non-exposure region adjacent an edge of the substrate.

14. The method of claim 11, wherein forming the plurality of stress-producing portions comprises:
forming a contraction stress-producing portion applying a stress that reduces a volume of the substrate; and
forming an expansion stress-producing portion applying a stress that expands the volume of the substrate.

15. The method of claim 11, further comprising:
determining registration errors of the plurality of photomask patterns before forming the plurality of stress-producing portions;
determining preliminary positions of the plurality of stress-producing portions based on the registration errors of the plurality of photomask patterns;
determining exposure latitude variations of the plurality of photomask patterns using the preliminary positions of the respective plurality of stress-producing portions, wherein forming the plurality of stress-producing portions in the substrate is based on magnitudes of the exposure latitude variations.

16. The method of claim 15, further comprising:
mapping the exposure latitude variations into an exposure latitude variation map; and
classifying the exposure latitude variations according to the magnitudes of the exposure latitude variations.

17. A method of forming a photomask, comprising:
forming a plurality of photomask patterns on a substrate;
determining registration errors of the plurality of photomask patterns;
determining preliminary positions of a respective plurality of stress-producing portions based on the registration errors of the plurality of photomask patterns;
determining exposure latitude variations of the plurality of photomask patterns using the preliminary positions of the respective plurality of stress-producing portions; and
determining first and second regions of the substrate based on magnitudes of the exposure latitude variations, wherein the first region has a first exposure latitude variation and the second region has a second exposure latitude variation smaller than the first exposure latitude variation; and
forming the plurality of stress-producing portions in the first and second regions of the substrate, wherein the first region comprises a lower density of the stress-producing portions than the second region.

18. The method of claim 17, wherein determining exposure latitude variations comprises calculating changes in a slope of a threshold value of an exposure intensity profile.

19. The method of claim 17, wherein the first region comprises a higher density of the photomask patterns than the second region.

* * * * *